United States Patent
Chung et al.

(10) Patent No.: US 10,719,103 B2
(45) Date of Patent: Jul. 21, 2020

(54) BENDABLE DISPLAY DEVICE

(71) Applicant: SAMSUNG DISPLAY CO., LTD., Yongin-si, Gyeonggi-do (KR)

(72) Inventors: Yun-Mo Chung, Yongin-si (KR); Dae Woo Lee, Hwaseong-si (KR); Jun Namkung, Asan-si (KR); Soon Ryong Park, Sejong-si (KR); Ju Yeop Seong, Asan-si (KR); Hyun Kyu Choi, Seoul (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/616,434

(22) Filed: Jun. 7, 2017

(65) Prior Publication Data
US 2017/0371376 A1 Dec. 28, 2017

(30) Foreign Application Priority Data
Jun. 28, 2016 (KR) .......................... 10-2016-0080852

(51) Int. Cl.
| | |
|---|---|
| *H05K 1/00* | (2006.01) |
| *G06F 1/16* | (2006.01) |
| *G02F 1/1345* | (2006.01) |
| *G02F 1/1333* | (2006.01) |
| *H05K 1/02* | (2006.01) |
| *H05K 7/00* | (2006.01) |

(Continued)

(52) U.S. Cl.
CPC ........ *G06F 1/1652* (2013.01); *G02F 1/13458* (2013.01); *G02F 1/133305* (2013.01); *H05K 1/028* (2013.01); *G06F 1/1601* (2013.01); *G06F 1/1616* (2013.01); *G09G 2380/02* (2013.01); *H01L 27/124* (2013.01); *H01L 27/1218* (2013.01); *H01L 27/3241* (2013.01)

(58) Field of Classification Search
CPC . G06F 1/1601; G06F 1/1616; H05K 2201/05; H05K 2201/10681; H05K 1/0277; H05K 1/028; H05K 1/0283; H05K 1/147; H05K 1/189; H05K 1/0393; H05K 2201/09445; H05K 1/118; H05K 1/11; H04M 1/0216; G02F 2001/13456; G02F 1/13458; G09G 2300/0408; G09G 2290/00
USPC ...................... 361/679.21, 679.27, 748, 749; 349/149–151
See application file for complete search history.

(56) References Cited

U.S. PATENT DOCUMENTS

| | | | |
|---|---|---|---|
| 5,523,873 A * | 6/1996 | Bradford ........... | G02F 1/133382 349/139 |
| 9,048,443 B2 | 6/2015 | Namkung et al. | |

(Continued)

FOREIGN PATENT DOCUMENTS

| | | |
|---|---|---|
| JP | 4360405 | 8/2009 |
| KR | 10-2004-0062197 | 7/2004 |
| KR | 10-2014-0055540 | 5/2014 |

OTHER PUBLICATIONS

European Search Report dated Nov. 27, 2017 in corresponding European Application No. 17178277.4. (6 pages).

*Primary Examiner* — Binh B Tran
(74) *Attorney, Agent, or Firm* — F. Chau & Associates, LLC

(57) ABSTRACT

A display device includes a display panel including a bendable display panel including a substrate and a plurality of pad portions on the substrate. The substrate includes a cutout between adjacent pad portions of the plurality of pad portions.

24 Claims, 18 Drawing Sheets

(51) Int. Cl.
   *H01L 27/12* (2006.01)
   *H01L 27/32* (2006.01)

(56) References Cited

U.S. PATENT DOCUMENTS

| | | |
|---|---|---|
| 9,196,848 B2 | 11/2015 | Namkung et al. |
| 9,214,640 B2 | 12/2015 | Lee et al. |
| 2002/0067456 A1 | 6/2002 | Tatsumi |
| 2005/0237467 A1* | 10/2005 | Takaishi .............. G02F 1/13452 349/149 |
| 2013/0161661 A1* | 6/2013 | Akamatsu ............... H01L 27/15 257/88 |
| 2013/0264103 A1* | 10/2013 | Ye ........................ H05K 1/0213 174/254 |
| 2014/0239277 A1 | 8/2014 | Kim et al. |
| 2015/0382446 A1* | 12/2015 | Kwon .................... H05K 1/028 174/251 |

* cited by examiner

BENDABLE DISPLAY DEVICE

CROSS-REFERENCE TO RELATED APPLICATION

This application claims priority under 35 U.S.C. § 119 to Korean Patent Application No. 10-2016-0080852 filed in the Korean Intellectual Property Office on Jun. 28, 2016, the disclosure of which is incorporated by reference herein in its entirety.

(a) TECHNICAL FIELD

Exemplary embodiments of the present invention relate to a display device, and more particularly to a bendable display device.

(b) DISCUSSION OF RELATED ART

Display devices such as an organic light emitting device and a liquid crystal display may be manufactured by generating a plurality of layers and elements on a substrate. The substrate of the display device may include glass. A glass substrate may be relatively rigid, relatively heavy and may break. Display devices may include a relatively flexible substrate that is relatively light, relatively strong against impacts, and may be relatively easily deformed.

A display device including a flexible substrate may be manufactured to bend at an edge where a pad portion to which a flexible printed circuit film (FPC) for transmitting signals is positioned, thus creating a relatively small dead space. When the dead space is reduced, a bezel width of the display device may be reduced and usage of an inner space of the display device may be increased, and thus the display device may be relatively small.

SUMMARY

One or more exemplary embodiments of the present invention provide a display device including a flexible substrate having increased reliability of a bending area and a pad area.

An exemplary embodiment of the present invention provides a display device including a bendable display panel including a substrate and a plurality of pad portions on the substrate. The substrate includes a cutout between adjacent pad portions of the plurality of pad portions.

The cutout may be dimensioned and positioned to at least partially isolate movement of a first pad portion from movement of a second pad portion when the bendable display panel is bent.

The display panel may include a display area displaying an image and a non-display area adjacent to the display area. The plurality of pad portions may be arranged along a first direction in the non-display area, and the cutout may extend in a second direction crossing the first direction.

The cutout may extend in the second direction from an edge of the display panel opposite the display area of the display panel.

The display panel may include a bending area between the display area and the pad portions, and the bending area may be bendable with respect to a bending axis extending in the first direction.

The bending area may include a plurality of wires, and the plurality of wires may extend along the second direction.

The display panel may include a plurality of fan-outs between the pad portions and the bending area, and the cutout may extend to a region between neighboring fan-outs.

The display device may include at least one flexible printed circuit film disposed on the pad portions, and an integrated circuit chip disposed on the flexible printed circuit film.

The cutout may penetrate the display panel in a thickness direction of the display panel.

An exemplary embodiment of the present invention provides a display device including a display panel including a display area displaying an image and a non-display area including a plurality of pad portions. At least one flexible printed circuit film is disposed on each of the plurality of pad portions. The pad portions are arranged along a first direction. The display panel includes a cutout between adjacent pad portions of the plurality of pad portions. The cutout extends in a second direction crossing the first direction.

The display panel may include a bending area between the display area and the pad portions, and the bending area may include a plurality of wires extending along the second direction.

The bending area may be bendable with respect to a bending axis extending in the first direction.

A flexible printed circuit film may be disposed on each of the pad portions. A driving circuit chip may be disposed on each of the flexible printed circuit films.

The cutout may extend in the second direction from an edge of the display panel opposite the display area of the display panel.

The display panel may include a plurality of fan-outs between the pad portions and the bending area, and the cutout may extend to a region between neighboring fan-outs.

A plane shape of an end portion of the cutout facing the display area of the display panel may be pointed, may be polygonal or may be round.

The cutout may penetrate the display panel in a thickness direction of the display panel.

An exemplary embodiment of the present invention provides a display device including a display panel including a display area displaying an image and a non-display area including a pad portion. A flexible printed circuit film is disposed on the pad portion. The pad portion includes a plurality of pads arranged along a first direction. The display panel includes a cutout formed between adjacent pads and extending in a second direction crossing the first direction.

The display panel may include a bending area between the display area and the pad portion, and the bending area may include a plurality of wires extending along the second direction.

The bending area may be bendable with respect to a bending axis extending in the first direction.

The cutout may be formed along the second direction from an edge of the display panel opposite the display area of the display panel.

The cutout may be formed in the second direction and may extend beyond the edge of the display panel by a predetermined distance in the pad portion.

The cutout may penetrate the display panel in a thickness direction of the display panel.

The cutout may be formed along a thickness direction of the display panel from a top surface of the display panel to a depth above a bottom surface of the display panel.

The display panel may include a substrate. The pad portion may be positioned on a first side of the substrate, and a protection film may be positioned on a second side of the substrate. The cutout may penetrate the substrate and may be formed through part of the protection film.

According to an exemplary embodiment of the present invention, application of a force to the wires in the bending area in a direction different from a bending direction may be controlled, and generation of cracks of the wires in the bending area may be reduced or prevented. A generation of waviness may be reduced or prevented in the pad area of the display panel.

BRIEF DESCRIPTION OF THE DRAWINGS

The above and other features of the inventive concept will become more apparent by describing in detail exemplary embodiments thereof, with reference to the accompanying, in which.

DETAILED DESCRIPTION OF THE EMBODIMENTS

Figure 1:
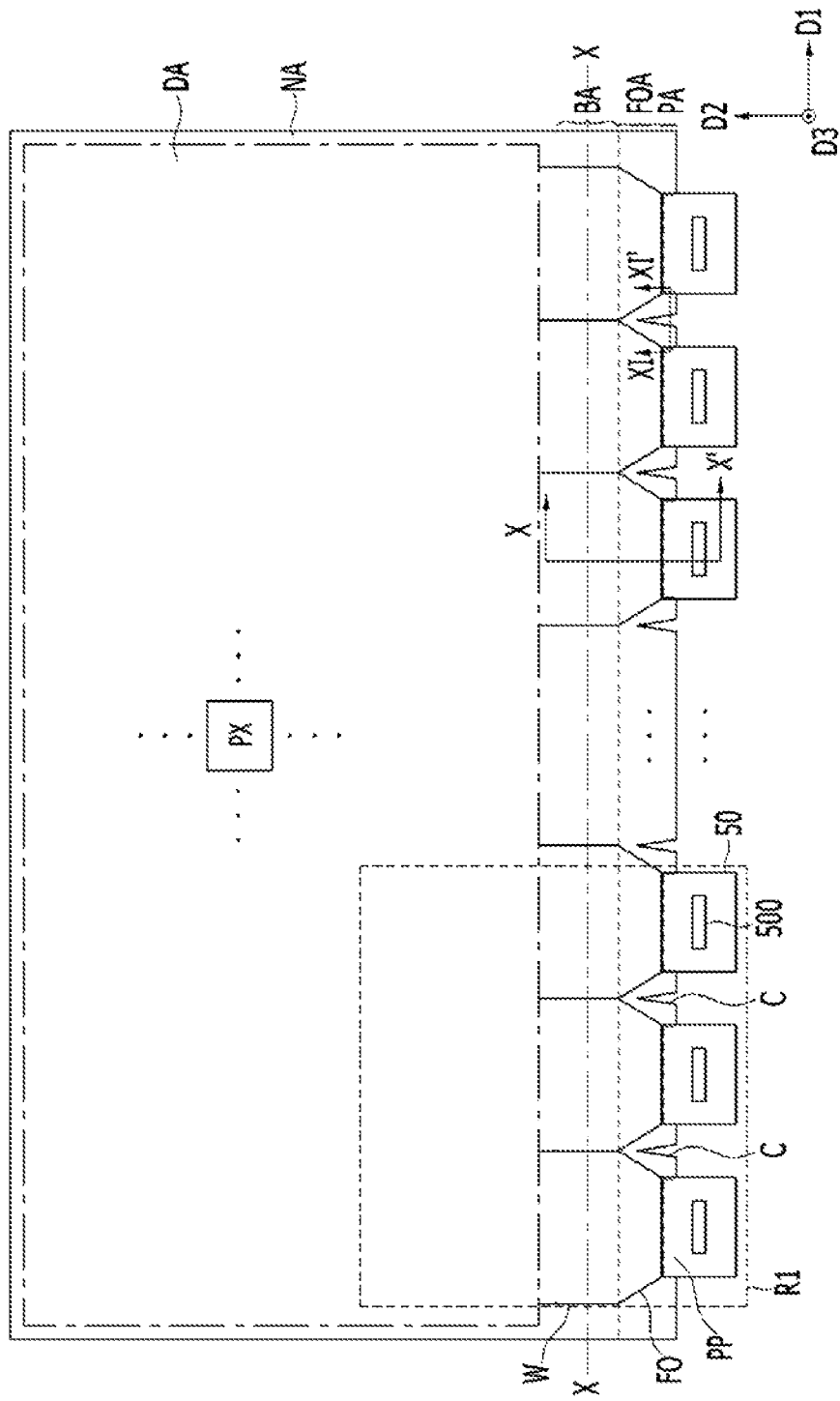
FIG. 1 is a top plan view of a display device that is not bent according to an exemplary embodiment of the present invention.

Exemplary embodiments of the present invention will be described in more detail below with reference to the accompanying drawings, in which exemplary embodiments of the preset invention are shown. As those skilled in the art would realize, the described embodiments may be modified in various different ways, all without departing from the spirit or scope of the present invention.

In the drawings, the thicknesses of layers, films, panels, or regions may be exaggerated for clarity. Like reference numerals may refer to like elements throughout the specification and drawings. It will be understood that when an element such as a layer, film, region, or substrate is referred to as being "on" another element, it may be directly on the other element or intervening elements may be present.

It will be understood that when an element such as a layer, film, region, or substrate is referred to as being "on" another element, it may be directly on the other element or intervening elements may also be present.

A display device according to an exemplary embodiment of the present invention will be described in more detail below with reference to accompanying drawings.

Figure 2:
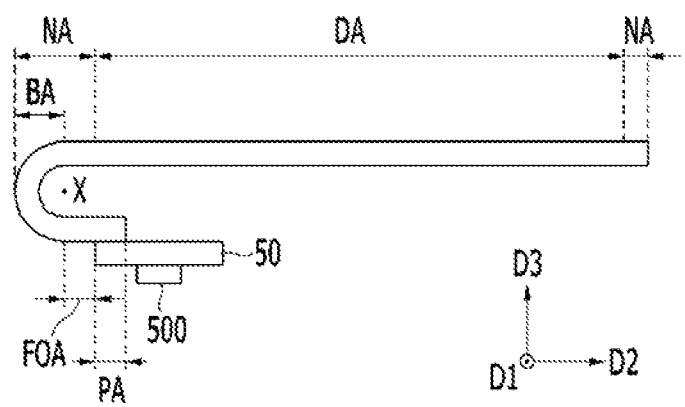
FIG. 2 is a side view of the display device shown in FIG. 1 that is bent.

FIG. 1 is a top plan view of a display device that is not bent according to an exemplary embodiment of the present invention. FIG. 2 is a side view of the display device shown in FIG. 1 that is bent.

Referring to FIG. 1, the display device may include a display panel 10 and at least one flexible printed circuit film 50 connected to the display panel 10.

The display panel 10 may include a display area (DA) displaying an image, and a non-display area (NA) in which elements and/or wires (W) generating various signals applied to the display area (DA) and/or transmitting the various signals are disposed. The non-display area may be adjacent to the display area (DA).

As an example, pixels PX may be arranged in a matrix in the display area (DA) of the display panel 10. In the display area (DA), signal lines including gate lines and data lines may be disposed. The gate lines may extend in a first direction D1 (e.g., a row direction), and the data lines may extend in a second direction D2 (e.g., a column direction) crossing the first direction D1. The gate lines may extend in a same direction as the data lines, for example, in the second direction D2.

At least one gate line and at least one data line may be connected to each of the pixels PX. Each pixel PX may receive a gate signal and a data signal from the signal lines. Regarding the organic light emitting device, driving voltage lines may extend, for example, in the second direction D2 and may transmit a driving voltage to the pixel PX. The driving voltage lines may be positioned in the display area (DA).

The non-display area (NA) of the display panel 10 may include a pad area (PA) including pad portions (PP) receiving signals from outside of the display panel 10. Each of the pad portions (PP) may include pads arranged, for example, in the first direction D1 at a predetermined interval. The pad portions (PP) may be disposed on an edge of the display panel 10 along the first direction D1 at a predetermined interval. A cutout (C) may be formed between the neighboring pad portions (PP). As an example, before the display panel 10 is bent, the cutouts (C) may be formed in the second direction D2 toward the display area (DA) from the edge of the display panel 10. However, a formation direction of the cutout (C) is not limited to the second direction D2, and the cutout (C) may be formed in a direction that is oblique to the second direction D2. The cutout (C) may fully penetrate the display panel 10 in a third direction D3 that is a thickness direction of the display panel 10.

Regarding the pad area (PA) of the display panel 10, neighboring pad portions (PP) may be partially separated from each other along the first direction D1 by the cutouts (C). Thus, when a pad portion of the pad portions (PP) is bent, it might not affect a neighboring pad portion (PP). Thus, stress applied to an area near a pad portion of the pad portions (PP) may be reduced or eliminated. For example, stress on wires (W) positioned in a bending area (BA) of the display panel 10 may be reduced or eliminated and thus an occurrence of cracks in the wires (W) may be reduced or eliminated.

As an example, the cutouts (C) may be formed by cutting the display panel 10 by use of laser beams or a knife, or by etching the display panel 10 through a photolithography process.

A first end of the flexible printed circuit film 50 may be connected to each pad portion (PP). An anisotropic conductive film may be disposed between the pad portions (PP) and the flexible printed circuit film 50. As an example, the flexible printed circuit film 50 may include a second end connected to a printed circuit board and transmitting signals such as control signals or image data.

A driving device generating and/or processing various signals for driving the display panel 10 may be positioned in the non-display area (NA) of the display panel 10 (e.g., on the flexible printed circuit film 50). The driving device may be disposed on the printed circuit board. The driving device may include a data driver applying a data signal to the data line, a gate driver applying a gate signal to the gate line, and a signal controller controlling the data driver and the gate driver.

The data driver may be an integrated circuit chip of a plurality of integrated circuit chips 500 disposed on the flexible printed circuit film 50. Each of the integrated circuit chips 500 may be connected as a tape carrier package to a pad portion of the pad portions (PP). The data driver may be positioned between the display area (DA) and the pad area (PA). The gate driver may be positioned in the non-display area (NA) on edges of the display panel 10 (e.g., on left/right sides of the display panel 10 along the first direction). As an example, the gate driver may be an integrated circuit chip of the integrated circuit chips 500. The signal controller may be an integrated circuit chip of integrated circuit chips 500 and may be connected to the printed circuit board. The signal controller may transmit control signals through the flexible printed circuit film 50.

The display panel 10 includes the bending area (BA) between the display area (DA) and the pad area (PA). The bending area (BA) may an area along the display panel 10 in the first direction D1. The display panel 10 may be bent along a bending axis (X), which is substantially parallel with the first direction D1. As an example, the flexible printed circuit films 50 may be positioned behind the display area (DA) when the display panel 10 is bent. According to an exemplary embodiment of the present invention, the bending area (BA) may be in the display area (DA) and the non-display area (NA); however exemplary embodiments of the present invention are not limited thereto. For example, the bending area (BA) may be entirely in the non-display area (NA).

A fan out area (FOA) may be between the bending area (BA) and the pad area (PA). The fan out area (FOA) may be positioned along the first direction D1. The fan out area (FOA) may include a plurality of fan-outs (FO). Wires (W) connected to the pads of the pad portions (PP) may be adjacent to the fan-outs (FO). The fan-outs (FO) may be positioned at a predetermined interval along the first direction D1. A separation between adjacent fan-outs (FO) may become gradually narrower along the second direction from the pad portions (PP) toward the display area (DA) of the display panel 10. The wires (W) may pass through the fan-out area (FOA) and the bending area (BA) and may be connected to various signal lines such as data lines. When the display panel 10 is not bent, the wires (W) may extend in the second direction D2 in the bending area (BA) and may be substantially perpendicular to the bending axis (X). The cutouts (C) positioned in the pad area (PA) may extend to a region between adjacent fan-outs (FO) of the fan out area (FOA). Thus, stress applied in the fan out area (FOA) when the display panel 10 is bent may be reduced or eliminated. The wires (W) are not positioned in the region in which the cutouts (C) are formed.

The cutouts (C) according to an exemplary embodiment of the present invention will be described in more detail below with reference to FIG. 3 and FIG. 4.

Figure 3:
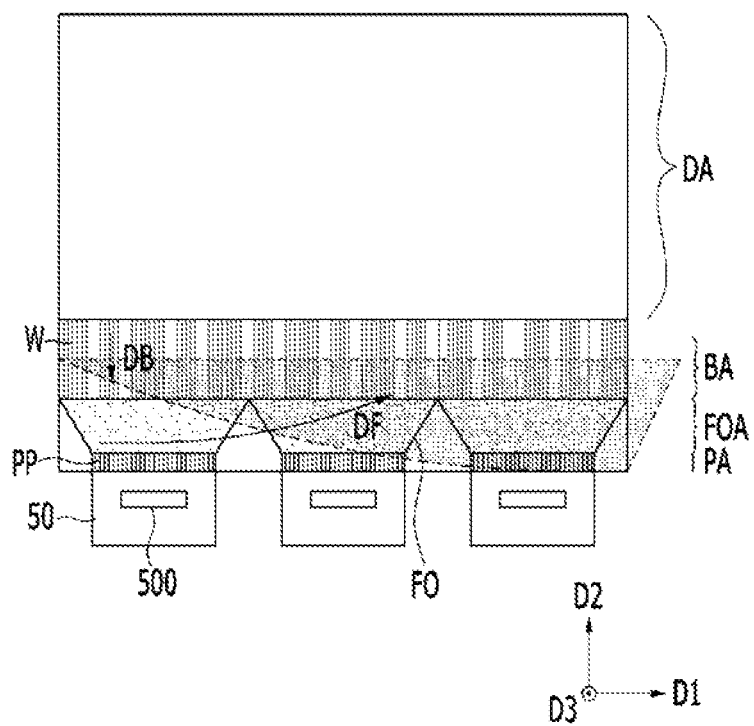
FIG. 3 illustrates a comparative example of a region R1 of FIG. 1.

FIG. 3 illustrates a comparative example of a region R1 of FIG. 1. FIG. 4 illustrates an exemplary embodiment of the region R1 of FIG. 1.

Referring to FIG. 3, a case in which a cutout is not formed between adjacent pad portions (PP) is illustrated. A flexible printed circuit film 50 on which an integrated circuit chip 500 is disposed may be connected to each pad portion (PP). During a process for transferring or bending the display device, a region near the pad portion (PP) may be folded in an undesired manner because of weight of the integrated circuit chip 500, and thus the folded region may be relatively wide. For example, when the region near a pad portion of the pad portions (PP) is folded, an adjacent pad portion of the pad portions (PP) may also be folded in a folding direction (DF). The folding direction (DF) may cross a bending direction (DB) of the bending area (BA). The wires (W) (e.g., a second wire portion 179 illustrated, for example, in FIG. 10) in the bending area (BA) may be configured to well withstand a stress in the bending direction (DB), but not in another direction than the bending direction (DB), and thus when stress is applied in the folding direction (DF) traversing the bending direction (DB), for example, the stress may cause the wires (W) to crack or short-circuit. Additionally, a relatively wide folding region may result in a plurality of wires (W) being damaged.

Figure 4:
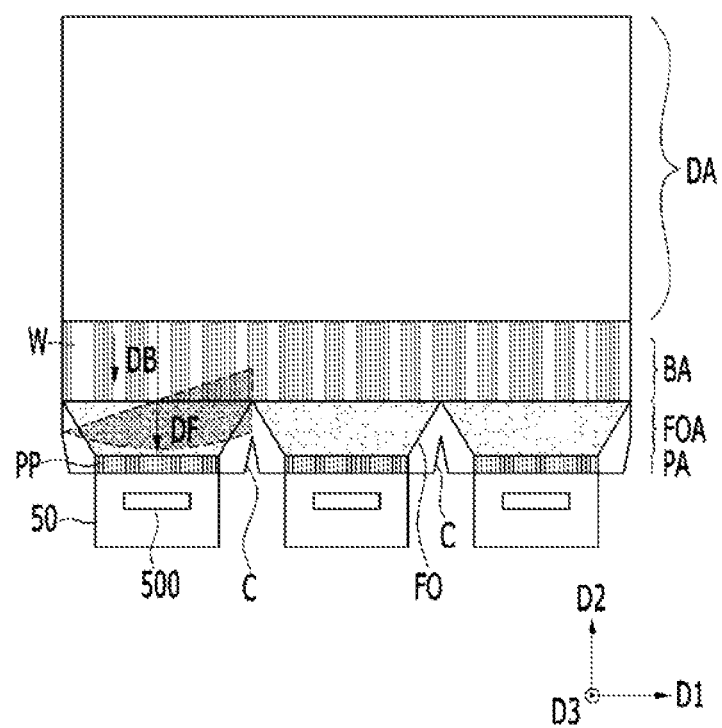
FIG. 4 illustrates an exemplary embodiment of a region R1 of FIG. 1.

Referring to FIG. 4, the cutout (C) may be formed between neighboring pad portions (PP). The flexible printed circuit film 50 on which the integrated circuit chip 500 is disposed may be connected to a corresponding pad portion (PP), and the region near the pad portion (PP) to which the flexible printed circuit film 50 is bonded may be undesirably folded by the weight of the integrated circuit chip 500. However, according to an exemplary embodiment of the present invention, when the region near a pad portion of the pad portions (PP) is folded, such folding does not extend to adjacent pad portions (PP) but is blocked by the cutout (C). Thus, the folding may be limited to the region corresponding to one pad portion (PP), and the folding direction (DF) may substantially correspond to the bending direction (DB) of the bending area (BA). When the folding direction (DF) substantially corresponds to the bending direction (DB), the cracking of the wires (W) may be reduced or eliminated. The cutout (C) may extend to a space between the fan-outs (FO) of the fan out area (FOA) from the edge of the display panel 10 thus further reducing an influence of folding a first pad portion on adjacent pad portions (PP).

The cutout (C) may have a V shape (or a plane shape of a triangle) that becomes narrower and pointed at an end of the V shaped cutout closer to the display area DA of the display panel; however exemplary embodiments of the present invention are not limited thereto. The cutout (C) according to some exemplary embodiments of the present invention will be described in more detail below with reference to FIG. 5 to FIG. 9.

FIG. 5, FIG. 6, FIG. 7, FIG. 8, and FIG. 9 each respectively illustrates an exemplary embodiment of a region R1 of FIG. 1.

Figure 5:
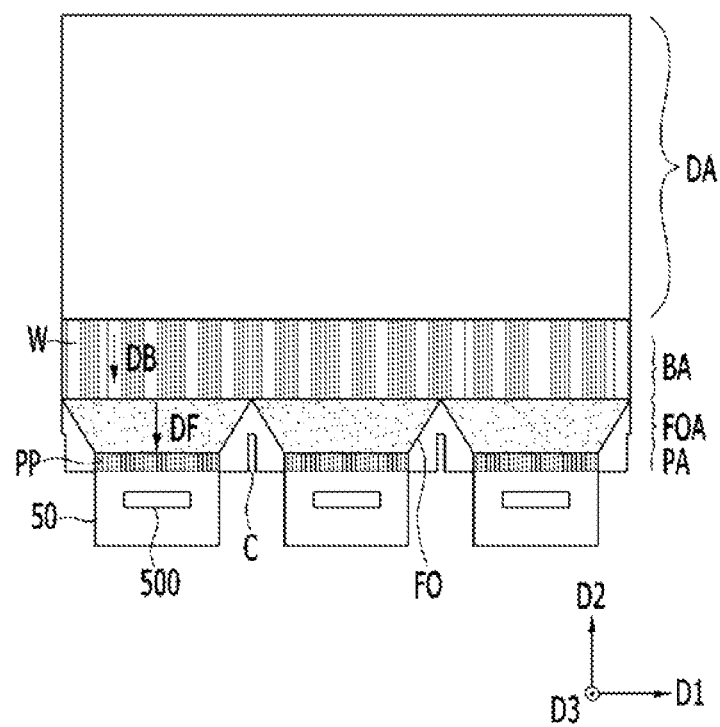
FIG. 5, FIG. 6, FIG. 7, FIG. 8, and FIG. 9 each respectively illustrates an exemplary embodiment of a region R1 of FIG. 1.
Figure 6:
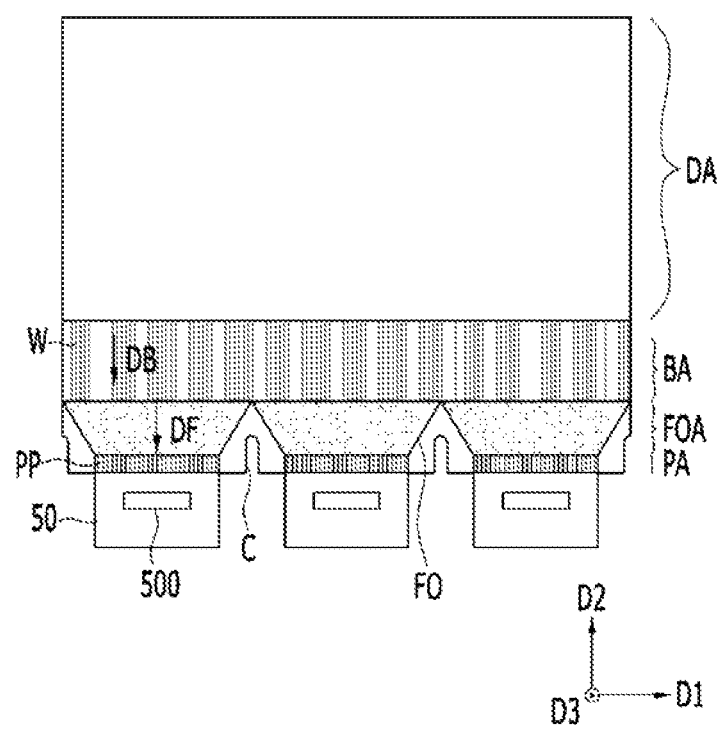
Figure 7:
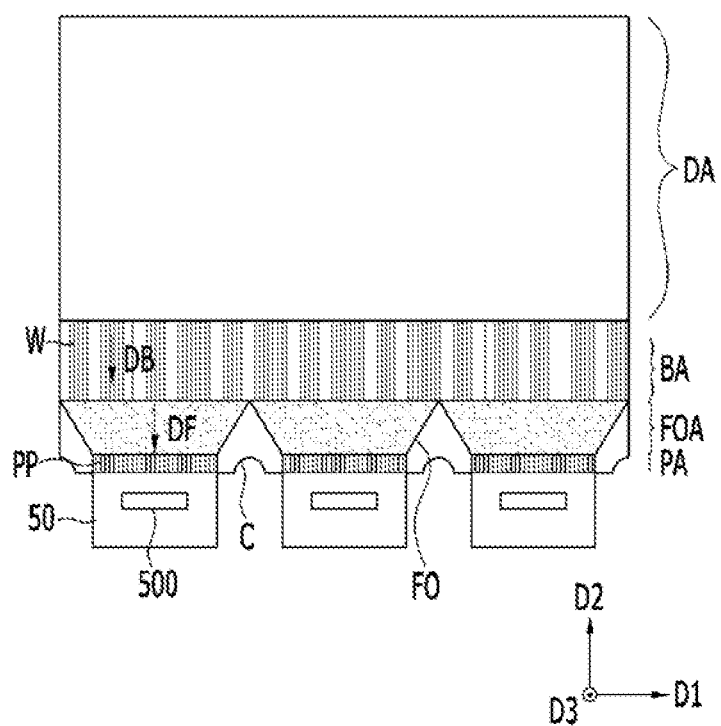
Figure 8:
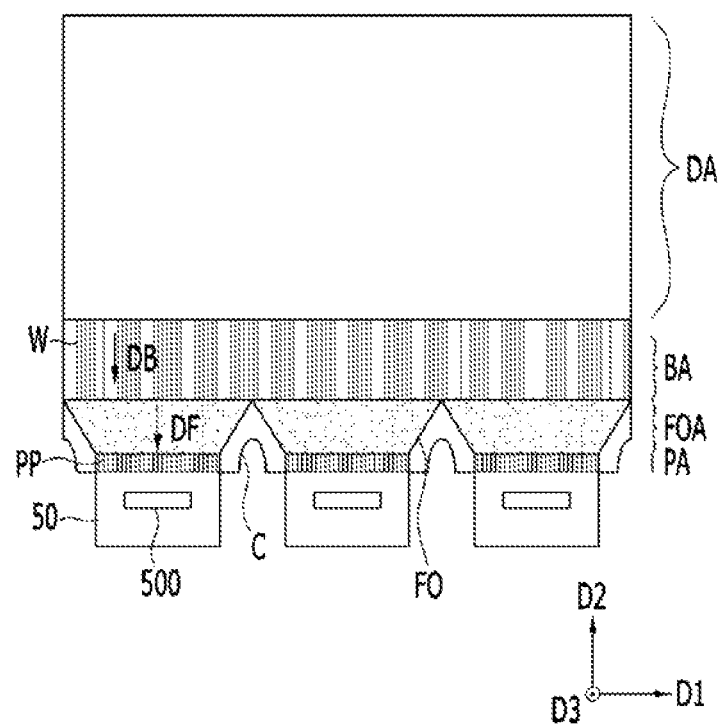

Referring to FIG. 5, the cutout (C) may have a plane shape of a rectangle with a substantially constant width. Referring to FIG. 6, the cutout (C) may have a substantially rectangular shape in which an end of the cutout (C) closest to the display area DA of the display panel is rounded. Referring to FIG. 7 and FIG. 8, the cutout (C) may have a plane shape of a semicircle or may have a plane shape of a semi-ellipse.

Figure 9:
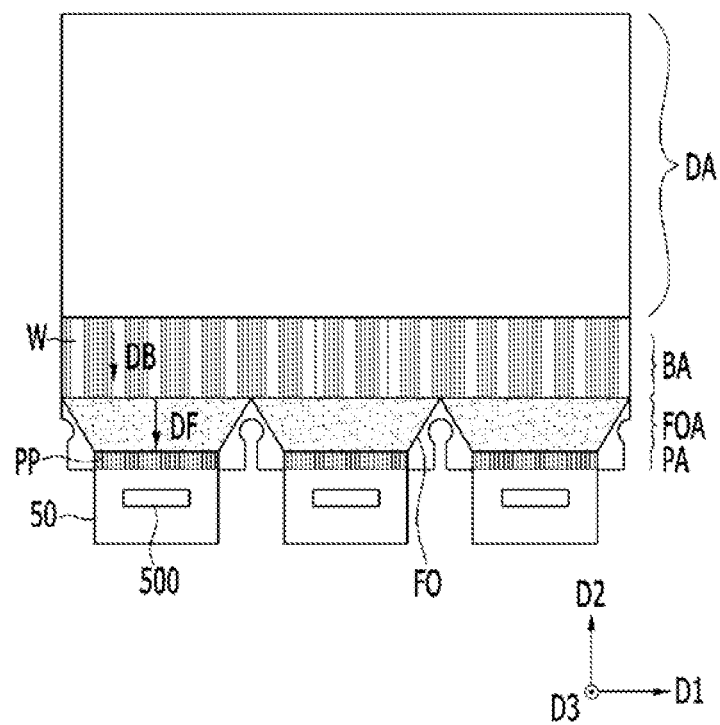

Referring to FIG. 9, the cutout (C) may have a plane shape of a light bulb. According to some exemplary embodiments of the present invention, the cutout (C) may have various shapes between the neighboring pad portions (PP), and the cutout (C) reduce or prevent the folding influence of a pad portion of the pad portions (PP) from being applied to adjacent pad portions (PP). Thus damage to the wires (W) in the bending area (BA) may be reduced or eliminated. Cutouts (C) may be formed between each adjacent pad portions (PP), or cutouts (C) between some pad portions (PP) may be omitted.

A stacked configuration of the display device according to some exemplary embodiments of the present invention will be described below in more detail with reference to the pixel PX of the non-display area (NA) and the display area (DA) in which the bending area (BA) and the pad area (PA) are provided.

Figure 10:
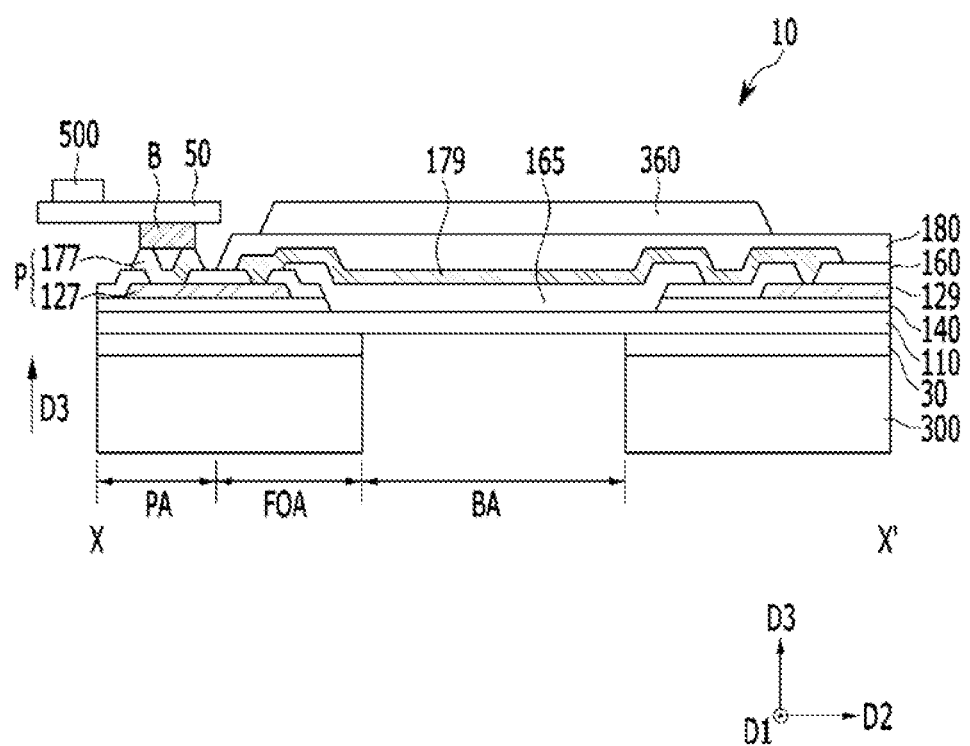
FIG. 10 illustrates s an exemplary embodiment of a cross-section with respect to a line X-X' in FIG. 1.
Figure 11:
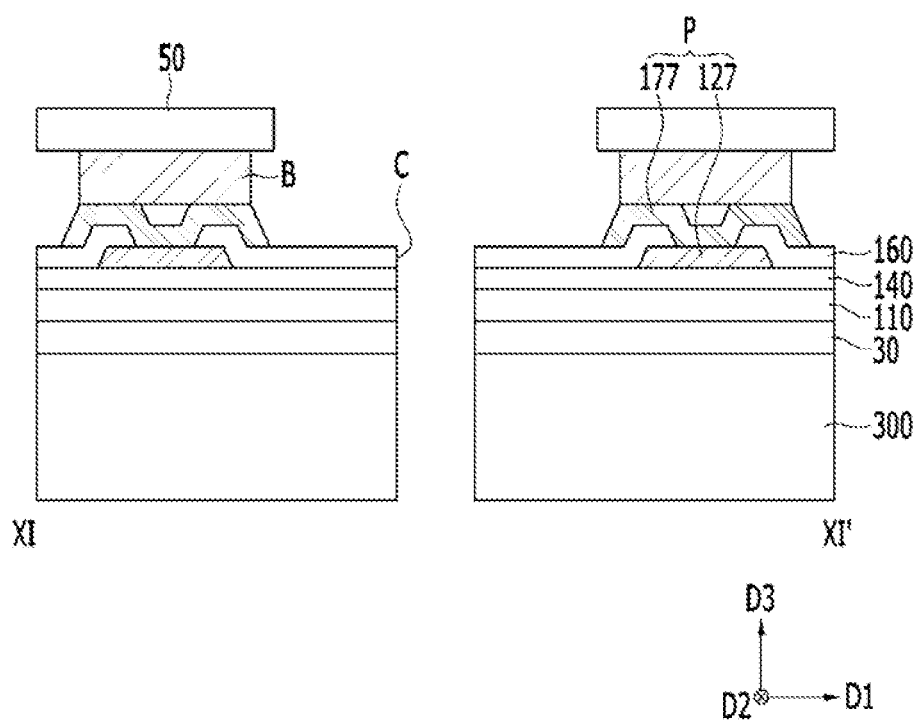
FIG. 11 illustrates an exemplary embodiment of a cross-section with respect to a line XI-XI' in FIG. 1.
Figure 12:
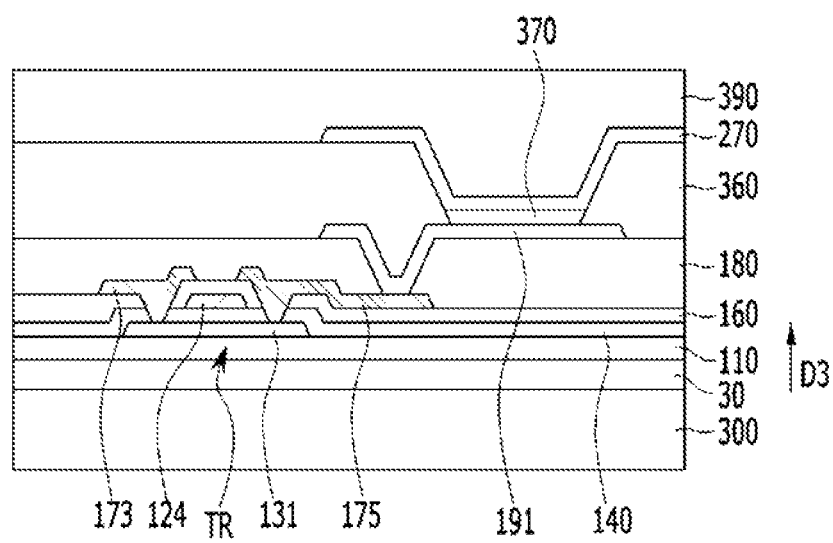
FIG. 12 illustrates an exemplary embodiment of a cross-section of a pixel area in FIG. 1.
Figure 13:
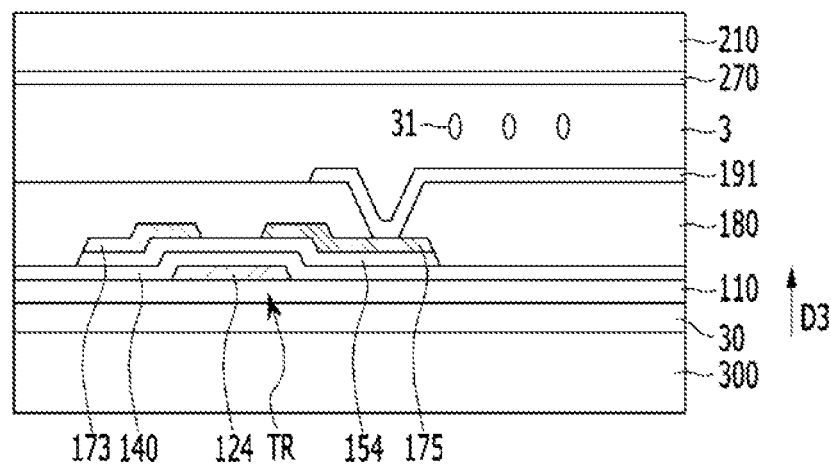
FIG. 13 illustrates an exemplary embodiment of a cross-section of a pixel area in FIG. 1.

FIG. 10 illustrates s an exemplary embodiment of a cross-section with respect to a line X-X' in FIG. 1. FIG. 11 illustrates an exemplary embodiment of a cross-section with respect to a line XI-XI' in FIG. 1. FIG. 12 illustrates an exemplary embodiment of a cross-section of a pixel area in FIG. 1. FIG. 13 illustrates an exemplary embodiment of a cross-section of a pixel area in FIG. 1.

FIG. 12 exemplifies a case in which the display device is an organic light emitting device, and FIG. 13 exemplifies a case in which the display device is a liquid crystal display. Configurations of FIG. 10 and FIG. 11 may be applied to display devices according to other exemplary embodiments of the present invention, regardless of the type of the display device. An organic light emitting device according to an exemplary embodiment of the present invention will be described below in more detail with reference to FIG. 10, FIG. 11, and FIG. 12. Technical features that are the same as those described above may be omitted, and thus duplicative descriptions may be omitted.

Referring to FIG. 10, FIG. 11, and FIG. 12, the display panel 10 may include a substrate 110 and a plurality of layers disposed on the substrate 110.

The substrate 110 may be a flexible substrate including a transparent polymer film. For example, the substrate 110 may include a plastic such as polyimide, polyamide, or polyethylene terephthalate.

The substrate 110 may include a buffer layer. The buffer layer may reduce or prevent a penetration of impurities or moisture into the substrate 110. The buffer layer may be formed on substantially the entire substrate 110, except for in the bending area (BA).

A semiconductor 131 of a transistor (TR) may be disposed on the substrate 110. A gate insulating layer 140 may be disposed on the semiconductor 131. The semiconductor 131 may include a source region, a drain region, and a channel region between the source and drain regions. The semiconductor 131 may include polysilicon, an oxide semiconductor, or amorphous silicon. The gate insulating layer 140 may be formed by stacking inorganic insulating materials such as a silicon oxide or a silicon nitride. The gate insulating layer 140 need not be provided in the bending area (BA). According to an exemplary embodiment of the present invention, the gate insulating layer 140 may be positioned in a region overlapping a first pad layer 127 or a gate conductor such as a gate electrode 124, and it need not be positioned in the pad area (PA).

The first pad layer 127 of a pad (P), a first wire portion 129 of the wire (W), and a gate conductor including the gate electrode 124 of the transistor (TR) may be positioned on the gate insulating layer 140. The first pad layer 127, the first wire portion 129, and the gate electrode 124 may be formed by stacking one or more conductive materials such as copper (Cu), aluminum (Al), silver (Ag), molybdenum (Mo), chromium (Cr), tantalum (Ta), or titanium (Ti) on the substrate 110 and patterning the one or more stacked conductive materials.

An interlayer insulating layer 160 may be disposed on the first pad layer 127, the first wire portion 129, and the gate electrode 124. The interlayer insulating layer 160 may include an inorganic material. The interlayer insulating layer 160 need not be positioned in the bending area (BA).

A second pad layer 177 of the pad (P), a second wire portion 179 of the wire (W), and a data conductor including a source electrode 173 and a drain electrode 175 of the transistor (TR) may be disposed on the interlayer insulating layer 160. The second pad layer 177 may overlap the first pad layer 127 and may be connected to the first pad layer 127 through a contact hole formed in the interlayer insulating layer 160. The second wire portion 179 may cross the bending area (BA) and may extend beyond the bending area (BA). The second wire portion 179 may be connected to an extension of the first pad layer 127 through first contact holes formed in the interlayer insulating layer 160 and may be connected to the first wire portion 129 through second contact holes formed in the interlayer insulating layer 160. The source electrode 173 and the drain electrode 175 may be connected to the source region and the drain region of the semiconductor 131, respectively, through contact holes formed in the interlayer insulating layer 160 and the gate insulating layer 140. As an example, the data conductor may include a metal such as copper (Cu), aluminum (Al), silver (Ag), molybdenum (Mo), chromium (Cr), gold (Au), platinum (Pt), palladium (Pd), tantalum (Ta), tungsten (W), titanium (Ti), or nickel (Ni), or a metal alloy thereof. For example, the data conductor may include aluminum with a relatively low Young's modulus or an aluminum-based metal such as an aluminum alloy. Thus, the second wire portion 179 of the wire (W) positioned in the bending area (BA) may experience a relatively low amount of stress during bending of the display panel, and thus an occurrence of a short-circuit during or after bending of the display panel may be reduced or eliminated.

In the bending area (BA), a protective layer 165 may be positioned between the substrate 110 and the second wire portion 179. The protective layer 165 may include an organic material.

A passivation layer 180 may be disposed on the second wire portion 179, the source electrode 173, and the drain electrode 175. The passivation layer 180 may include an organic material. In the bending area (BA), the second wire portion 179 may be positioned between the protective layer 165 and the passivation layer 180. Thus, damage to the second wire portion 179 may be reduced or prevented by the protective layer 165 and the passivation layer 180 when is the second wire portion 179 is bent. The passivation layer 180 need not be positioned in the pad area (PA), or the passivation layer 180 may be positioned between the adjacent pads (P).

A pixel electrode 191 may be disposed on the passivation layer 180. The pixel electrode 191 may be connected to the drain electrode 175 through the contact hole formed in the passivation layer 180 and may receive a data signal.

A pixel definition layer 360 may be disposed on the passivation layer 180 and on at least a part of the pixel electrode 191. The pixel definition layer 360 may include an opening overlapping the pixel electrode 191. In the opening of the pixel definition layer 360, an emission layer 370 may be disposed on the pixel electrode 191, and a common electrode 270 may be disposed on the emission layer 370. The pixel electrode 191, the emission layer 370, and the common electrode 270 may form an organic light emitting diode. The pixel electrode 191 may be an anode of the organic light emitting diode, and the common electrode 270 may be a cathode of the organic light emitting diode. The common electrode 270 may include a transparent conductive material such as an indium tin oxide (ITO) or an indium zinc oxide (IZO). An encapsulation layer 390 protecting the organic light emitting diode may be disposed on the common electrode 270. The encapsulation layer 390 may include at least one organic material layer and/or at least one inorganic material layer.

The pixel definition layer 360 and the encapsulation layer 390 might not be positioned on the pad portion (PP), thus exposing the pad (P). The pixel definition layer 360 may be provided in the bending area (BA), and the encapsulation layer 390 need not be provided therein. In the bending area (BA), a bending protection layer releasing and protecting against tensile stress of the second portion 179 of the wire (W) may be positioned on the pixel definition layer 360.

The flexible printed circuit film 50 including bumps (B) may be positioned on the pad portion (PP). An anisotropic conductive film including conductive particles may be positioned between the pad (P) and the flexible printed circuit film 50. The anisotropic conductive film may bond the flexible printed circuit film 50 to the pad portion (PP) and electrically connect the pad (P) and the bump (B).

A protection film 300 may be positioned below the substrate 110. The protection film 300 may be attached to the substrate 110 by an adhesive layer 30 such as a pressure sensitive adhesive (PSA) or an optically clear adhesive (OCA). The protection film 300 may be a polymer film, and it may include a plastic such as polyethylene terephthalate, polyethylene naphthalate, polyethylene sulfide, polyethylene, or polyimide. The protection film 300 need not be positioned in the bending area (BA), which may reduce a bending stress of the bending area (BA).

Referring to FIG. 11, the cutout (C) may be formed between adjacent pad portions (PP). Each of the cutouts (C) may penetrate the display panel 10 in a third direction D3. The third direction D3 may be a thickness direction of the display panel 10. Thus, the cutouts (C) may be formed in the substrate 110. The insulating layers 140 and 160 may be positioned above the cutouts (C), and the protection film 300 may be positioned below the cutouts (C).

Referring to FIG. 13, the gate electrode 124 of the transistor (TR) may be disposed on the substrate 110, and the gate insulating layer 140 may be disposed on the gate electrode 124. A semiconductor 154 may be disposed on the gate insulating layer 140, and the source electrode 173 and the drain electrode 175 of the transistor (TR) may be disposed on the semiconductor 154.

The passivation layer 180 may be disposed on the source electrode 173 and the drain electrode 175, and the pixel electrode 191 may be disposed on the passivation layer 180. The pixel electrode 191 may be connected to the drain electrode 175 through the contact hole formed in the passivation layer 180 and may receive a data signal.

A liquid crystal layer 3 including liquid crystal molecules 31 may be disposed on the pixel electrode 191, and an insulating layer 210 sealing the liquid crystal layer 3 may be positioned on the liquid crystal layer 3. The insulating layer 210 may have substantially a same shape as a shape of the substrate 110.

The common electrode 270 may provide an electric field to the liquid crystal layer 3 together with the pixel electrode 191. The common electrode 270 and the pixel electrode 191 may control a directional orientation of the liquid crystal molecules 31. An alignment layer may be positioned between the pixel electrode 191 and the liquid crystal layer 3 and between the liquid crystal layer 3 and the common electrode 270

According to an exemplary embodiment of the present invention, the common electrode 270 may be positioned between the substrate 110 and the liquid crystal layer 3.

A display device according to an exemplary embodiment of the present invention will be described in more detail below with reference to FIG. 14 to FIG. 18. The same constituent elements or features as in the above-described exemplary embodiments might not be described again, and thus duplicative descriptions may be omitted.

Figure 14:
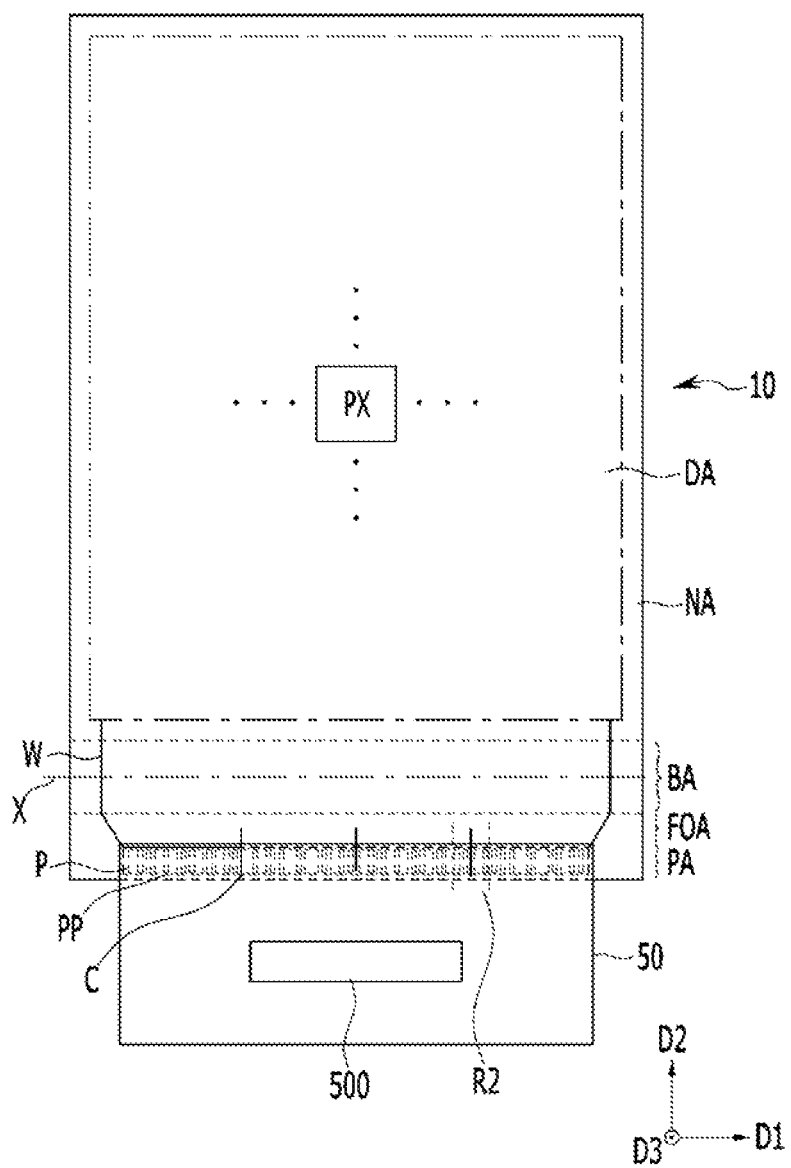
FIG. 14 is a top plan view of a display device that is not bent according to an exemplary embodiment of the present invention.
Figure 15:
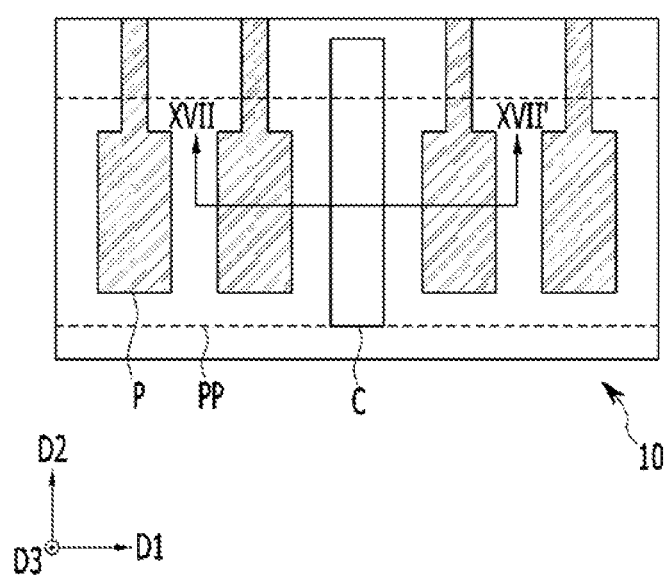
FIG. 15 illustrates an exemplary embodiment of a region R2 of FIG. 14.
Figure 16:
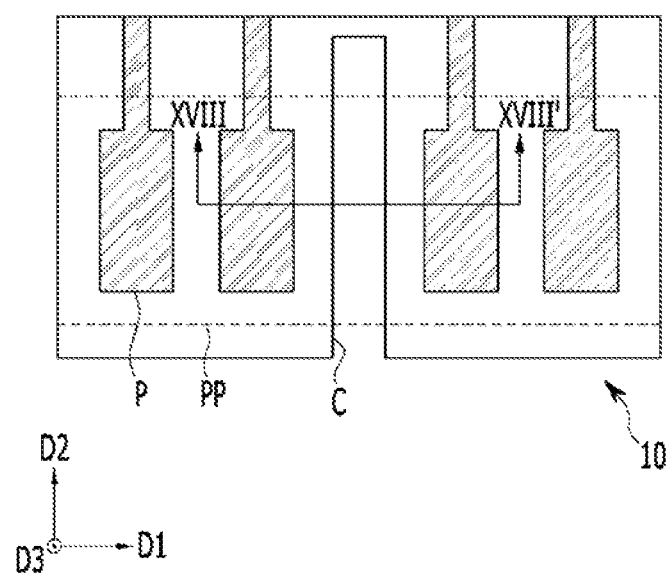
FIG. 16 illustrates an exemplary embodiment of a region R2 of FIG. 14.
Figure 17:
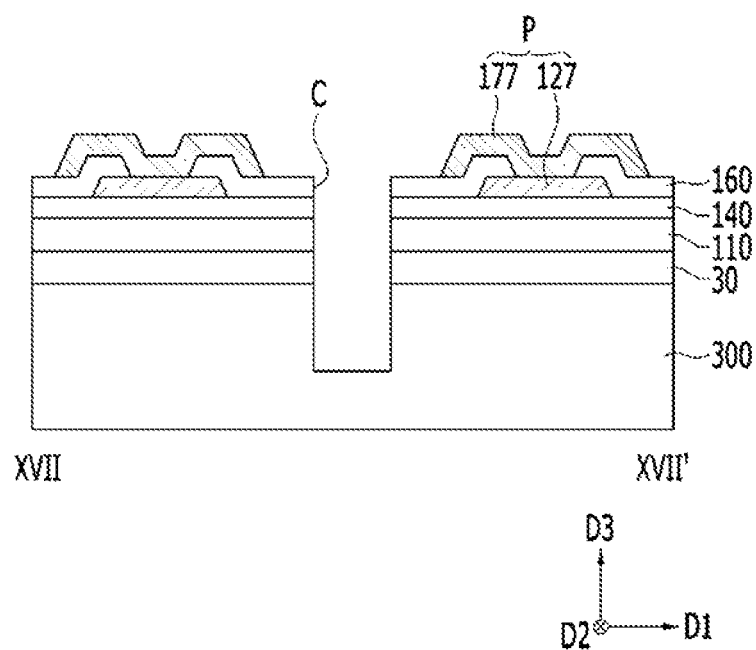
FIG. 17 illustrates an exemplary embodiment of a cross-section along a line XVII-XVII' of FIG. 15.
Figure 18:
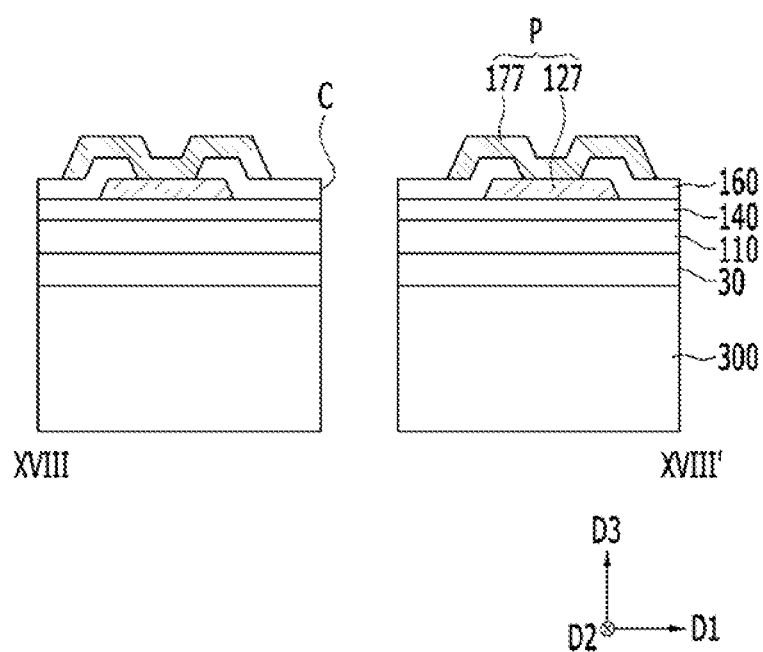
FIG. 18 illustrates an exemplary embodiment of a cross-section along a line XVIII-XVIII' of FIG. 16.

FIG. 14 is a top plan view of a display device that is not bent according to an exemplary embodiment of the present invention. FIG. 15 illustrates an exemplary embodiment of a region R2 of FIG. 14. FIG. 16 illustrates an exemplary embodiment of a region R2 of FIG. 14. FIG. 17 illustrates an exemplary embodiment of a cross-section along a line XVII-XVII' of FIG. 15. FIG. 18 illustrates an exemplary embodiment of a cross-section along a line XVIII-XVIII' of FIG. 16.

Referring to FIG. 14, the display device may include the display panel 10 and the flexible printed circuit film 50 connected to the display panel 10.

The display panel 10 may include the display area (DA) in which pixels PX are positioned, and the non-display area (NA) adjacent to the display area (DA). The non-display area (NA) may include the bending area (BA), the fan out area (FOA), and the pad area (PA). The display panel 10 may be bent with respect to the bending axis (X), which may be substantially parallel with the first direction D1 in the bending area (BA). The integrated circuit chips 500 may each be disposed on a respective one of the flexible printed circuit films 50. The integrated circuit chips 500 may be disposed in the non-display area (NA) of the display panel 10, for example, between the pad area (PA) and the bending area (BA).

The pad portions (PP) may be positioned along the first direction D1 in the pad area (PA) on the edge of the display panel 10. The pad portions (PP) may include pads (P) disposed at a predetermined interval along the first direction D1. In an exemplary embodiment of the present invention, a plurality of flexible printed circuit films 50 may be connected to the display panel 10. Each of the flexible printed circuit films 50 may include a pad portion (PP). The display panel according to one or more exemplary embodiments of the present invention may be a relatively small display panel. According to an exemplary embodiment of the present invention, a plurality of pad portions (PP) may be disposed in the pad area (PA), and a flexible printed circuit film 50 may disposed on each of the pad portions.

The cutouts (C) may be formed between adjacent pads (P). The cutouts (C) may be formed in the display panel 10, and may also be formed in the flexible printed circuit film 50. For example, the flexible printed circuit film 50 may be connected to the pad portion (PP) the cutout (C) may penetrate the display panel 10 and the flexible printed circuit film 50.

FIG. 15 and FIG. 16 show the display panel 10 excluding the flexible printed circuit film 50 in the region R2 of FIG. 14. Referring to FIG. 15, the cutout (C) may be formed substantially along the second direction D2 from an edge of the pad portion (PP) opposite the display area DA of the display panel 10 toward the display area DA of the display panel 10. Referring to FIG. 16, the cutout (C) may be formed from a point outside the pad portion (PP) opposite the display area DA of the display panel 10 and toward the display area DA of the display panel 10.

FIG. 17 and FIG. 18 illustrate cross-sections of cutouts (C) in the third direction D3, which may be a thickness direction of the display panel 10. The cutouts (C) may be generated in the thickness direction of the display panel 10 from an upper side of the display panel 10 to a predetermined depth. For example, referring to FIG. 17, the cutout (C) may penetrate the substrate 110 and the adhesive layer 30 from the insulating layers 140 and 160 of the substrate 110 to reach part of the protection film 300. Referring to FIG. 18, the cutout (C) may fully penetrate the display panel 10 from the upper side of the display panel 10 to the protection film 300.

The pad area (PA) may be thinner than the display area (DA), and thus the pad portion (PP) may be exposed. Thus, the pad area (PA) may have relatively low stiffness, which may result in waviness of the pad area. When the cutout (C) is generated in the pad area (PA) according to an exemplary embodiment of the present invention, the cutout (C) may reduce or eliminate stress applied to the pad area (PA), which may reduce or eliminate a generation of waviness.

While the present invention has been shown and described with reference to the exemplary embodiments thereof, it will be apparent to those of ordinary skill in the art that various changes in form and detail may be made thereto without departing from the spirit and scope of the present invention.

What is claimed is:

1. A display device comprising
a display panel including:
a substrate,
a plurality of pad portions, a display area and a bending area on the substrate, wherein the bending area is disposed between the display area and the plurality of pad portions, and wherein the plurality of the pad portions include a first pad portion and a second pad portion adjacent to each other, and
a protective film including a first protective film under the display area and a second protective film under the pad portions;
a first flexible printed circuit film disposed on the first pad portion; and
a second flexible printed circuit film disposed on the second pad portion and adjacent to the first flexible printed circuit film,
wherein the first protective film and the second protective film are separated from each other,
wherein the substrate further includes a cutout between adjacent the first and second pad portions,
wherein the cutout penetrates the substrate and the second protective film of the display panel in a thickness direction of the display panel,
wherein the first pad portion and the second pad portion are arranged along a first direction and the first flexible printed circuit film and the second flexible printed circuit film are spaced apart from each other in the first direction,
wherein a widest width of the cutout in the first direction is smaller than a spacing between the first and second flexible printed circuit films, and wherein no additional flexible printed circuit film exists between the first and second flexible printed circuit films.

2. The display device of claim 1, wherein
the display panel further includes a non-display area adjacent to the display area,
the plurality of pad portions are arranged along a first direction in the non-display area, and
the cutout extends in a second direction crossing the first direction.

3. The display device of claim 2, wherein
the cutout extends in the second direction from an edge of the display panel opposite the display area of the display panel.

4. The display device of claim 3, wherein
the bending area is bendable with respect to a bending axis extending in the first direction.

5. The display device of claim 4, wherein
the bending area includes a plurality of wires, and
the plurality of wires extend along the second direction.

6. The display device of claim 5, wherein
the display panel includes a plurality of fan-outs between the pad portions and the bending area, and
the cutout continuously extends from between the adjacent pad portions to a region between adjacent fan-outs of the plurality of fan-outs.

7. The display device of claim 1, further comprising:
at least one flexible printed circuit film disposed on each of the pad portions; and
an integrated circuit chip disposed on each of the flexible printed circuit films.

8. The display device of claim 1, wherein
the cutout penetrates the display panel in the thickness direction of the display panel.

9. A display device comprising:
a display panel including a display area displaying an image and a non-display area including a plurality of pad portions, wherein the plurality of the pad portions include a first pad portion and a second pad portion adjacent to each other;
a first flexible printed circuit film disposed on the first pad portion; and
a second flexible printed circuit film disposed on the second pad portion and adjacent to the first flexible printed circuit film,
wherein the first pad portion and the second pad portion are arranged along a first direction and the first flexible printed circuit film and the second flexible printed circuit film are spaced apart from each other in the first direction,
wherein the display panel includes a cutout between the first and second pad portions and the cutout extends in a second direction crossing the first direction,
wherein a widest width of the cutout in the first direction is smaller than a spacing between the first and second flexible printed circuit films, and
wherein no additional flexible printed circuit film exists between the first and second flexible printed circuit films.

10. The display device of claim 9, wherein
the display panel includes a bending area between the display area and the first and second pad portions, and
the bending area includes a plurality of wires extending along the second direction.

11. The display device of claim 10, wherein
the bending area is bendable with respect to a bending axis extending in the first direction.

12. The display device of claim 11, further comprising:
a driving circuit chip disposed on each of the first and second flexible printed circuit films.

13. The display device of claim 12, wherein
the cutout extends in the second direction from an edge of the display panel opposite the display area of the display panel.

14. The display device of claim 13, wherein
the display panel includes a plurality of fan-outs between the plurality of pad portions and the bending area, and
the cutout extends to a region between neighboring fan-outs.

15. The display device of claim 9, wherein
a plane shape of an end portion of the cutout facing the display area of the display panel is pointed, polygonal, or round.

16. The display device of claim 9, wherein
the cutout penetrates the display panel in a thickness direction of the display panel.

17. A display device comprising:
a display panel including a display area displaying an image and a non-display area including a pad portion; and
a flexible printed circuit film disposed on the pad portion,
wherein the pad portion includes a plurality of pads arranged along a first direction,
the display panel includes a cutout formed between adjacent pads and extending in a second direction crossing the first direction,
the display panel includes a substrate, the pad portion positioned on a first side of the substrate, and a protection film positioned on a second side of the substrate,
the protection film is attached to the substrate by an adhesive layer and has a thickness larger than that of the substrate, and
the cutout penetrates the substrate and the adhesive layer and is formed through at least a part of the protection film in a thickness direction of the display panel.

18. The display device of claim 17, wherein
the display panel includes a bending area between the display area and the pad portion, and
the bending area includes a plurality of wires extending along the second direction.

19. The display device of claim 18, wherein
the bending area is bendable with respect to a bending axis extending along the first direction.

20. The display device of claim 17, wherein
the cutout is formed along the second direction from an edge of the display panel opposite the display area of the display panel.

21. The display device of claim 17, wherein
the cutout is formed in the second direction and extends beyond an edge of the display panel by a predetermined distance in the pad portion.

22. The display device of claim 17, wherein
the cutout entirely penetrates the display panel in the thickness direction of the display panel.

23. The display device of claim 17, wherein
the cutout is formed along the thickness direction of the display panel from a top surface of the display panel to a depth above a bottom surface of the display panel.

24. The display device of claim 1,
wherein the plurality of pad portions are connected to wires to receive signals from outside of the display panel, and
wherein no wires are connected to the cutout.

* * * * *